US010771080B1

(12) United States Patent
Bacigalupo

(10) Patent No.: US 10,771,080 B1
(45) Date of Patent: Sep. 8, 2020

(54) SYSTEM AND METHOD FOR MODE CONTROL USING AN INPUT OF AN ANALOG-TO-DIGITAL CONVERTER

(71) Applicant: Infineon Technologies AG, Neubiberg (DE)

(72) Inventor: Tommaso Giovanni Bacigalupo, Fuerstenfeldbruck (DE)

(73) Assignee: INFINEON TECHNOLOGIES AG, Neubiberg (DE)

(*) Notice: Subject to any disclaimer, the term of this patent is extended or adjusted under 35 U.S.C. 154(b) by 0 days.

(21) Appl. No.: 16/376,229

(22) Filed: Apr. 5, 2019

(51) Int. Cl.
*H03M 1/12* (2006.01)
*H03K 17/567* (2006.01)

(52) U.S. Cl.
CPC ............ *H03M 1/12* (2013.01); *H03K 17/567* (2013.01)

(58) Field of Classification Search
CPC ................................ H03K 17/567; H03M 1/12
USPC .................................................. 327/108, 109
See application file for complete search history.

(56) References Cited

U.S. PATENT DOCUMENTS

| 559,442 | A | 5/1896 | Drumm et al. |
| 5,166,685 | A | 11/1992 | Campbell, Jr. et al. |
| 5,850,195 | A | 12/1998 | Berlien, Jr. et al. |
| 6,239,732 | B1 | 5/2001 | Cusey |
| 2007/0126619 | A1* | 6/2007 | McGrath ................ G01K 7/01 341/155 |
| 2017/0317021 | A1* | 11/2017 | Iyoshi .................... H01L 23/50 |
| 2019/0393146 | A1* | 12/2019 | Iyoshi .................... H03M 1/12 |

OTHER PUBLICATIONS

NXP, "MC33GD3100 Advanced IGBT Gate Driver," Short data sheet: advance information, Rev. 3.1, Oct. 26, 2018, 19 pages.
Allegro MicroSystems LLC, "Automotive, Three Phase MOSFET Driver," A4911, A4911-DS Preliminary, Jun. 1, 2016, 61 pages.
Infineon, "EiceDriver Sense High Voltage IGBT Driver for Automotive Applications—1EDI2010AS Single Channel Isolated Driver," Data Sheet Hardware Description Rev. 2.0, Jun. 19, 2016, 135 pages.
O'Sullivan, Dara et al., "Isolated Motor Control Feedback Using the ADSP-CM402F/ADSP-CM403F/ADSP-CM407F/ADSP-CM408F Sinc Filters and the AD7403," Analog Devices, AN-1265, www.analog.com, Application Note, Jan. 23, 2018, 20 pages.

* cited by examiner

*Primary Examiner* — William Hernandez
(74) *Attorney, Agent, or Firm* — Slater Matsil, LLP

(57) ABSTRACT

In accordance with an embodiment, a method includes performing an analog-to-digital conversion on a signal at an input pin of an integrated circuit using an analog-to-digital converter having a first input range, monitoring the signal at the input pin using a first comparator having a first threshold outside of the first input range, operating the integrated circuit in a first mode when the signal at the input pin is within the first input range, and operating the integrated circuit in a second mode different from the first mode when the signal at the input pin is outside of the first input range and crosses the first threshold.

25 Claims, 5 Drawing Sheets

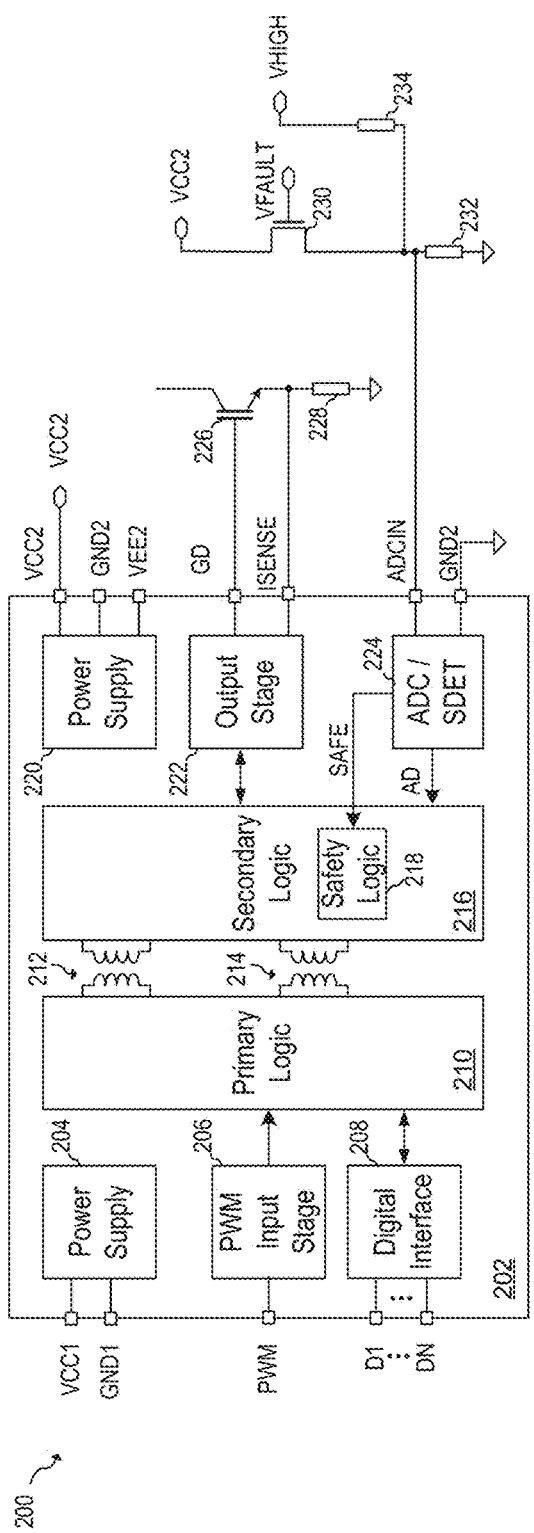
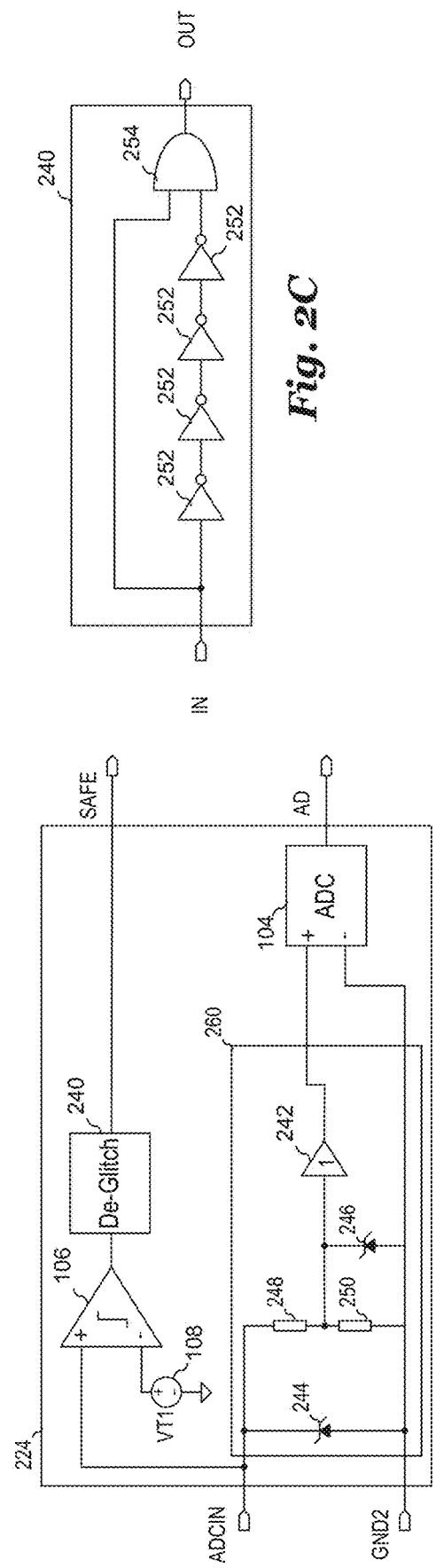
Fig. 2A
Fig. 2B
Fig. 2C

SYSTEM AND METHOD FOR MODE CONTROL USING AN INPUT OF AN ANALOG-TO-DIGITAL CONVERTER

TECHNICAL FIELD

The present invention relates generally to a system and method for mode control using an input of an analog-to-digital converter.

BACKGROUND

Shrinking semiconductor feature sizes has led to an increase in the number of circuits and functions that can be implemented on a single integrated circuit. In the automotive area, single chip solutions are becoming available for radio frequency (RF) sub-systems such as automotive radar, audio and video entertainment systems, automotive control systems, and automotive safety systems. Often, the limiting factor in how many features can be included on a single chip is not the amount of circuitry that can be included on a single piece of silicon, but rather the number of pins that can be included on a package.

In safety critical automotive systems, such as airbag controllers, safety related redundancy and failure modes often dictate increased functionality for a particular subsystem. For example, a particular component may be configured to operate in a "failure mode" or a "safety mode" in addition to its primary function during normal operation. One example of this is an engine or motor controller that performs a predetermined deactivation sequence upon notification of an accident or other failure. The implementation of the predetermined deactivation sequence often requires the presence of additional signaling and power supply paths to support the failure modes and/or safe operation during accidents. The implementation of such additional signaling and power supply paths poses challenges to the design of single-chip systems and subsystems with respect to the number of package pins used by the single-chip system.

SUMMARY

In accordance with an embodiment, a method includes performing an analog-to-digital conversion on a signal at an input pin of an integrated circuit using an analog-to-digital converter having a first input range, monitoring the signal at the input pin using a first comparator having a first threshold outside of the first input range, operating the integrated circuit in a first mode when the signal at the input pin is within the first input range, and operating the integrated circuit in a second mode different from the first mode when the signal at the input pin is outside of the first input range and crosses the first threshold.

In accordance with another embodiment, an integrated circuit includes an analog-to-digital converter (ADC) having an input coupled to an input pin of the integrated circuit, the ADC configured to have a first input range, a first comparator having an input coupled to the input pin, the first comparator having a first threshold outside of the first input range, and a control circuit coupled to the first comparator and configured to operate the integrated circuit in a first mode when a signal at the input pin is within the first input range, and operate the integrated circuit in a second mode different from the first mode when the signal at the input pin is outside of the first input range and crosses the first threshold.

In accordance with a further embodiment, a system includes a driver integrated circuit that includes an analog-to-digital converter (ADC) having an input coupled to an input pin of the driver integrated circuit, the ADC having a first input range, a first comparator having an input coupled to the input pin, the first comparator including a first threshold outside of the first input range, a driver circuit coupled to an output of the first comparator, the driver circuit having an output configured to drive a control node of a transistor and being configured to operate in a normal operating mode, when a signal at the input pin is within the first input range, and in a safety mode, when the signal at the input pin crosses the first threshold.

BRIEF DESCRIPTION OF THE DRAWINGS

For a more complete understanding of the present invention, and the advantages thereof, reference is now made to the following descriptions taken in conjunction with the accompanying drawings, in which:

FIG. 2A illustrates a gate driver system 200 according to an embodiment; FIG. 2B illustrates an analog-to-digital converter and signal detection circuit according to an embodiment; and FIG. 2C illustrates a deglitching circuit;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for controlling a mode using an input of an analog to digital converter in a single-chip gate driver circuit. The invention, however, may also be applied to other types of single-chip systems and subsystems including, but not limited to RF systems, audio systems, control systems and processing systems.

In accordance with an embodiment, extra functionality is imparted to an input pin of an analog-to-digital converter by using a comparator circuit coupled to the input pin in parallel with the analog-to-digital converter. In various embodiments, the analog-to-digital converter, the comparator circuit, and additional functional circuits are disposed on a single integrated circuit deposed, for example, on a single semiconductor substrate. In some embodiments, the semiconductor substrate may be a silicon substrate. The comparator circuit may have a threshold that lies outside of the normal input range of the analog-to-digital converter. Thus, by providing a signal at the input of the analog-to-digital converter that has a voltage outside the normal input range of the analog-to-digital converter and exceeds the threshold of the comparator circuit, a digital signal can be communicated to the additional functional circuits disposed on the integrated circuit via the input pin of the analog-to-digital converter.

In the specific case of a gate driver integrated circuit configured to drive one or more transistors, such as switching transistors or power transistors, the digital signal communicated via the input pin of the analog-to-digital converter may be used to activate a safety mode within the functional circuit of the gate driver integrated circuit. This activated safety mode may be used to set a gate driver disposed on the gate driver integrated circuit to a predetermined state, such as a low state, a high state, or a high-impendence state (e.g., tristate).

Figure 1A:
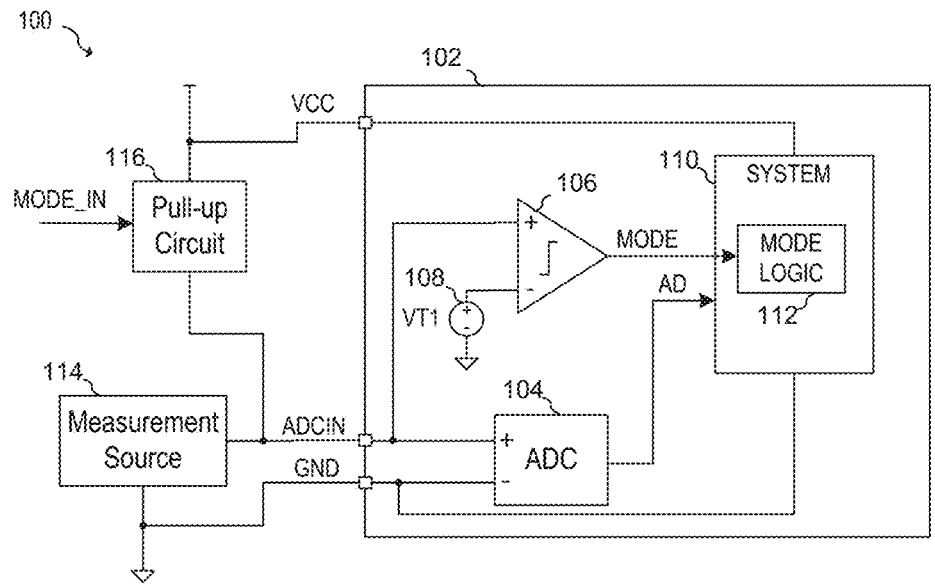
FIG. 1A is a block diagram that illustrates a system according to an embodiment.

FIG. 1A illustrates a system 100 according to an embodiment of the present invention that is directed to a general system-on-a-chip that includes an analog-to-digital-converter 104. As shown, system 100 includes an integrated circuit 102 coupled to a measurement source 114 and a pull-up circuit 116. Integrated circuit 102 includes system function 110, an analog-to-digital converter 104 coupled to measurement source 114 and pull-up circuit 116, and a comparator 106 coupled to reference voltage 108.

Integrated circuit 102 may be implemented, for example, on a single monolithic semiconductor substrate using a wide variety of different semiconductor technologies. Some embodiment circuits may be implemented using bipolar, CMOS, and BiCMOS processes known in the art. CMOS processes may include, for example, bulk CMOS processes, CMOS processes using thin or thick film silicon on insulator (SOI) or other processes. As shown, integrated circuit 102 includes a power pin/terminal VCC configured to be coupled to a power supply node, an ADC input pin/terminal ADCIN and a ground pin/terminal GND for illustration. It should be appreciated that in various embodiments of the present invention integrated circuit 102 may also include other pins appropriate the various circuits and functions implemented by integrated circuit 102. Each pin or terminal of integrated circuit 102 may represent a contact pad on integrated circuit 102 that can be externally coupled to other circuitry using known packaging techniques. Integrated circuit 102 may be disposed in a package and/or may be configured to be directed bonded to a circuit boarding using, for example, solder bumps.

System function 110 represents circuitry on integrated circuit 102 that implements one or more useful functions or circuits. For example, system function 110 may include, but is not limited to communications functions such as RF or wireline communications, power supply functions including a switched mode power supply controller, switching functions including switching controller or a switch driver, audio and/or video functions, automotive functions and processing functions.

As is further shown, system 100 includes mode logic 112 that controls a mode of system function 110. Thus, in various embodiments, system 100 may be configured to operate in at least one or two modes. In one example, system function 110 may operate in a first mode, such as normal or nominal operating mode, as well as a second mode, such as a safety mode, a configuration mode, or a test mode. The first mode, or normal/nominal operation mode, may include a mode in which integrated circuit 102 operates under normal use. For example, if system function 110 is a power supply controller, the first mode of operation would include functions directed to controlling a power converter while is it transferring power from a power source to a load. The second mode of operation may include a safety mode in which integrated circuit 102 is used to provide a predetermined state in the case of a system failure, and/or a mode in which a predetermined safety operation is performed, such as an orderly system shutdown sequence. Some safety modes may have a limited time duration.

In some embodiments, the second mode of operation may also include a test mode in which integrated circuit 102 is configured to output test and configuration data, such as the content of internal test registers, or in which integrated circuit 102 is configured to run one or more preconfigured built-in self-test (BIST). The second mode may also include a configuration mode in which various circuits and systems present on or controlled by integrated circuit 102 undergo calibration and/or configuration. Such a calibration mode may include the offset and gain calibration of analog signal paths and/or may include a mode in which configuration registers (not shown) present on integrated circuit 102 are loaded with data (e.g., data stored in read-only memory (ROM) or loaded on to volatile or non-volatile memory resident on integrated circuit 102. In alternative embodiments, the second mode of operation may include a second normal or nominal operation mode of system function 110.

Measurement source 114 represents any circuit, system or input source that provides an analog signal that can be converted to a digital signal via analog-to-digital converter 104. Measurement source 114 can include, for example, a sensor such as a temperature sensor, a pressure sensor, an acoustic sensor, a light sensor, a power sensor or any other type of sensor. In embodiments in which integrated circuit 102 supports an RF application, measurement source 114 may represent a received signal strength indicator (RSSI) circuit. In other embodiments, measurement source 114 may also include any measurable signal and/or interface to any measurable signal within a system, such as a current or a voltage. For example, measurement source 114 may be configured to provide an input or output voltage of system 100 and/or an appropriately scaled version of an input or output voltage of system 100. In some embodiments, measurement source 114 may include a plurality of measurement sources. In such embodiments, an analog multiplexer or switching circuit (not shown) may be used to select between the plurality of measurement sources. While measurement source 114 is shown to be external to integrated circuit 102, measurement sources internal to integrated circuit 102 may also be used.

As shown, the input of analog-to-digital converter 104 is coupled to measurement source 114 via input pin/terminal ADCIN, and the output of analog-to-digital converter 104 is coupled to system function 110 via digital output AD. In various embodiments, digital output AD provides a digital representation of the input signal present at input pin/terminal ADCIN. In various embodiments, analog-to-digital converter 104 may be implemented using any type of analog-to digital converter architecture including, but not limited to, sigma-delta, successive approximation, flash, pipeline, integrating and/or dual slope. Analog-to-digital converter 104 may be implemented using any sampling rate and bit width. In one specific example, analog-to-digital converter 104 may be an 8-bit A/D converter with a sampling rate of 3 kHz and a full-scale input range of 0 V to 5V. Alternatively, other bit widths, sampling rates and input ranges could be used.

In various embodiments, comparator 106 also has an input terminal that is coupled to input pin/terminal ADCIN. As shown, comparator 106 has a reference voltage 108 coupled to its negative input terminal to represent a threshold voltage VT1 of comparator 106. In some embodiments, threshold voltage VT1 is set to be a voltage outside of the full-scale input range of analog-to-digital converter 104. In some embodiments, threshold voltage VT1 can be set to a voltage that is greater than the full-scale input range of analog-to-digital converter 104, while in other embodiments, threshold voltage VT1 can be lower than the full-scale input range of analog-to-digital converter 104.

In alternative embodiments, the threshold voltage VT1 of comparator 106 may be physically implemented in a manner different from directly introducing an input offset voltage. For example, in some embodiments, the threshold voltage VT1 of comparator 106 may be implemented by introducing an offset current or by using offset device sizes within the structure of comparator 106.

During operation, comparator 106 monitors a signal at input pin/terminal ADCIN. In various embodiments, the second mode of operation may be activated by introducing a voltage on input pin/terminal ADCIN that crosses threshold VT1 of comparator 106. Such a voltage can be introduced, for example, by pulling the voltage of input pin/terminal ADCIN up to the voltage of power pin/terminal VCC via pull-up circuit 116. In some embodiments, pull-up circuit 116 is configured to apply the voltage of power pin/terminal VCC to input pin/terminal ADCIN when input signal MODE_IN is asserted. Pull-up circuit 116 may be implemented using pull-up circuits known in the art, for example, a pull-up transistor (also known as a clamp transistor) having a control node coupled to input signal MODE_IN and a load path coupled between input pin/terminal ADCIN and power pin/terminal VCC. Such a transistor may include, for example, a PMOS transistor, an NMOS transistor, a bipolar transistor, or other transistors known in the art.

In an example embodiment in which the full-scale input range of analog-to-digital converter 104 is between 0V and 5V, threshold voltage VT1 is set to about 9V, and the voltage of power pin/terminal VCC is set to 12V, the second mode of operation of system function 110 may be entered by activating pull-up circuit 116 to cause the voltage of input pin/terminal to reach 12 V (which exceeds the threshold voltage VT1 of 9V). In other embodiments, other voltages may be used. Once comparator 106 detects that the voltage of input pin/terminal ADCIN exceeds threshold voltage VT1, the output of comparator 106 is activated to signal mode logic 112 within system function 110 to activate the second mode of operation.

Figure 1B:
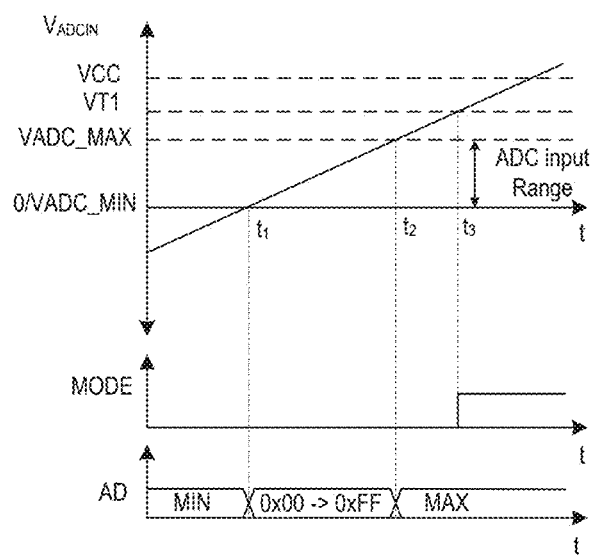
FIG. 1B illustrates graphs that depict the operation of the system of FIG. 1A.

FIG. 1B illustrates graphs showing various signals of system 100 over time. More specifically, FIG. 1B illustrates voltage $V_{ADCIN}$ of input pin/terminal ADCIN, output signal MODE of comparator 106, and the digital output AD of analog-to-digital converter 104. As shown, analog-to-digital converter 104 has an input range of between VADC_MIN and VADC_MAX. In the particular example of FIG. 1B, VADC_MIN is set to be about 0V, however, other voltages may be used. As shown, when voltage $V_{ADCIN}$ of input pin/terminal ADCIN is less than VADC_MIN at times less than $t_1$, the digital output AD of analog-to-digital converter 104 is a minimum digital value, which may be 0x00 depending on the coding scheme of analog-to-digital converter 104. When voltage $V_{ADCIN}$ of input pin/terminal ADCIN is within the input range defined by voltages VADC_MIN and VADC_MAX between times $t_1$ and $t_2$, analog-to-digital converter 104 produces output codes that correspond to the input voltages at input pin/terminal ADCIN. In one example, a voltage of VADC_MIN produces an output code of 0x00, a voltage of VADC_MAX produces an output code of 0xFF, while voltages between VADC_MIN and VADC_MAX produce codes between 0x00 and 0xFF. When voltage $V_{ADCIN}$ of input pin/terminal ADCIN exceeds VADC_MAX at time $t_2$, the digital output AD of analog-to-digital converter 104 is a maximum digital value, which may be 0xFF depending on the coding scheme of analog-to-digital converter 104. At time $t_3$, when voltage $V_{ADCIN}$ of input pin/terminal ADCIN exceeds threshold VT1, output signal MODE of comparator 106 becomes high. It should be understood that the ADC input range and relative position of threshold VT1 with respect to the ADC input range represent just one example combination of many possible combinations of ADC input ranges and relative threshold positions for embodiment systems. In alternative embodiments, the input range of analog-to-digital converter 104 may comprise any input range. For example, all of, or a portion of the input range of analog-to-digital converter 104 correspond to negative voltages for input pin/terminal ADCIN and/or may not include 0V within the input range. In some embodiments, VADC_MIN and/or VADC_MAX may be less than zero or greater than zero.

Figure 1C:
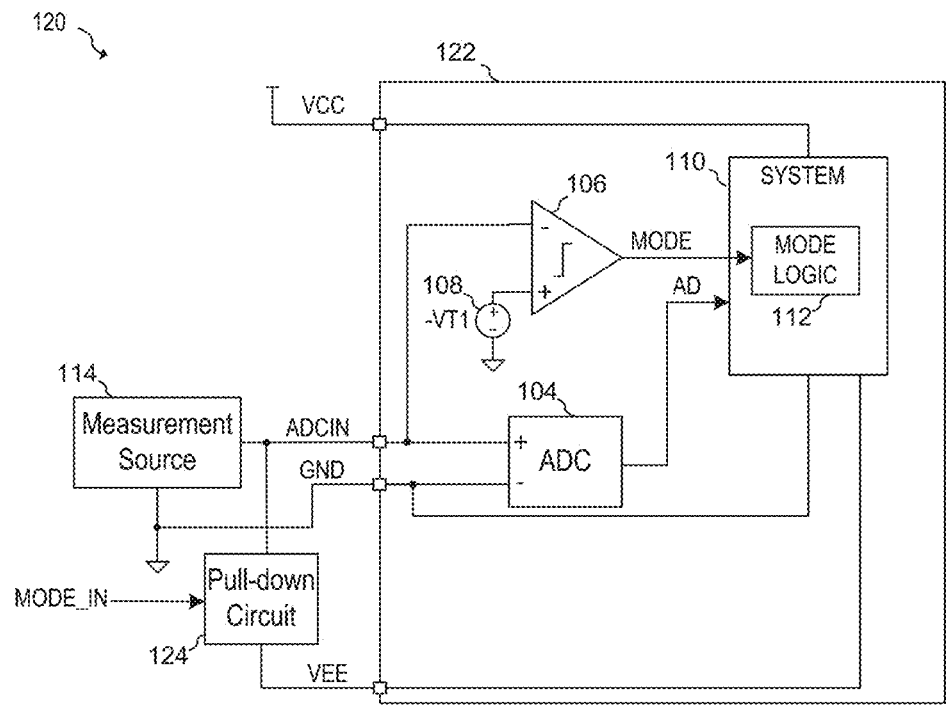
FIG. 1C is a block diagram that illustrates a system according to a further embodiment.

FIG. 1C illustrates a system 120 that supports threshold VT1 that is less than zero volts. As shown, system 120 includes integrated circuit 122 that is similar to integrated circuit 102 shown in FIG. 1A, with the exception that reference voltage 108 produces a negative voltage threshold −VT1 instead of a positive voltage threshold. In addition, comparator 106 is shown with a negative input terminal coupled to input pin/terminal ADCIN (instead of the positive terminal) in order for output signal MODE to be asserted when the voltage at input pin/terminal ADCIN is less than −VT1.

System 120 of FIG. 1C also differs from system o100 of FIG. 1A in that it includes a pull-down circuit 124 coupled to a negative power supply pin/terminal VEE instead of pull-up circuit 116 coupled to positive power pin/terminal VCC. Thus, in various embodiments, the second mode of operation may be activated by introducing a voltage on input pin/terminal ADCIN that is less than threshold VT1. Such a voltage can be introduced, for example, by pulling the voltage of input pin/terminal ADCIN down to the negative voltage of power pin/terminal VEE via pull-down circuit 124. In some embodiments, pull-up circuit 124 is configured to apply the voltage of negative power pin/terminal to input pin/terminal ADCIN when input signal MODE_IN is asserted. Pull-down circuit 124 may be implemented using pull-down circuits known in the art, for example, a pull-down transistor (also known as a clamp transistor) having a control node coupled to input signal MODE_IN and a load path connected between input pin/terminal ADCIN and negative power pin/terminal VEE. Such a transistor may include, for example, a PMOS transistor, an NMOS transistor, a bipolar transistor, or other transistors known in the art.

In an example embodiment in which the full-scale input range of analog-to-digital converter 104 is between 0 V and 5 V, threshold voltage VT1 is set to about −2 V, the voltage of first power pin/terminal VCC1 is set to 12 V, and the voltage of negative power pin/terminal −VEE is set to −4 V, the second mode of operation of system function 110 may be entered by activating pull-down circuit 124 to cause the voltage of input pin/terminal to reach −4 V (which is less than the threshold voltage VT1 of −2 V). Alternatively, other voltages and full-scale input ranges may be used. For example, the full-scale input range of analog-to-digital converter 104 may include negative voltages. Once comparator 106 detects that the voltage of input pin/terminal ADC is less than threshold voltage −VT1, the output of comparator 106 is activated to signal mode logic 112 within system function 110 to activate the second mode of operation.

Figure 1D:
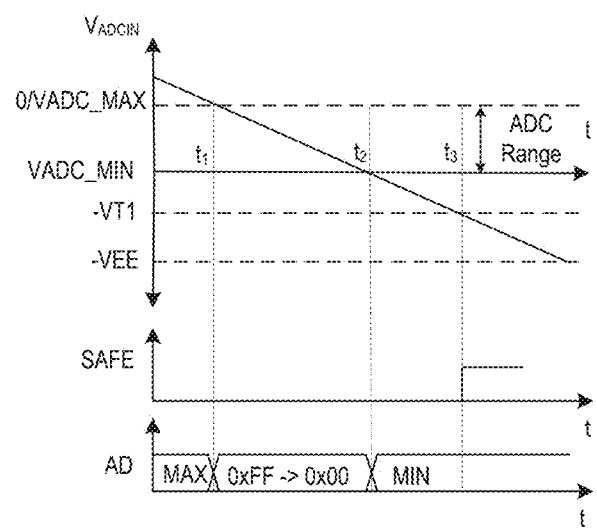
FIG. 1D illustrates graphs that depict the operation of the system of FIG. 1C.

FIG. 1D illustrates graphs showing various signals of system 120 over time. More specifically, FIG. 1D illustrates voltage $V_{ADCIN}$ of input pin/terminal ADCIN, output signal MODE of comparator 106, and the digital output AD of analog-to-digital converter 104. In the particular example of FIG. 1D, analog-to-digital converter 104 has an input voltage range that includes negative input voltages where VADC_MIN is set to a negative voltage and VADC_MAX set to 0V, however, other voltages may be used.

As shown, when voltage $V_{ADCIN}$ of input pin/terminal ADCIN is greater than VADC_MAX at times less than $t_1$, the digital output AD of analog-to-digital converter 104 is a maximum digital value, which may be 0xFF depending on the coding scheme of analog-to-digital converter 104. When voltage $V_{ADCIN}$ of input pin/terminal ADCIN is within input range defined by voltages VADC_MIN and VADC_MAX between times $t_1$ and $t_2$, analog-to-digital converter 104 produces output codes that correspond to the input voltages at input pin/terminal ADCIN. In one example, a voltage of VADC_MIN produces an output code of 0x00, a voltage of VADC_MAX produces an output code of 0xFF, while voltages between VADC_MAX and VADC_MIN produce codes between 0xFF and 0x00. When voltage $V_{ADCIN}$ of input pin/terminal ADCIN decreases below VADC_MAX at time $t_2$, the output of the digital output AD of analog-to-digital converter 104 is a minimum digital value, which may be 0x00 depending on the coding scheme of analog-to-digital converter 104. At time $t_3$, when voltage $V_{ADCIN}$ of input pin/terminal ADCIN is below threshold −VT1, output signal MODE of comparator o16 becomes high. It should be understood that the ADC input range and relative position of threshold −VT1 represent just one example combination of many possible combinations of ADC input ranges and relative threshold positions for embodiment systems.

Embodiment concepts can be applied to a wide variety of applications. For example, FIG. 2A illustrates a gate driver system 200 according to an embodiment of the present invention. As shown, gate driver system 200 includes gate driver integrated circuit 202 that includes circuitry that can be used to drive transistor 226 for switching applications. In addition to the various circuits used to support driving transistor 226, gate driver integrated circuit 202 includes an embodiment analog-to-digital converter and signal detection circuit 224 that is used to provide both analog-to-digital conversion and mode selection as describe in embodiments herein.

Gate driver integrated circuit 202 is configured as a galvanically isolated gate driver that includes a primary side configured to be coupled to system control circuitry that is referenced to a first power domain defined by a first power pin/terminal VCC1 and first ground pin/terminal GND1, and a secondary side that is configured to be coupled to switching circuits and measurement circuits that are referenced to a second power domain defined by positive second power pin/terminal VCC2, second ground pin/terminal GND2 and negative power pin/terminal VEE2.

On the primary side, gate driver integrated circuit 202 includes primary side power supply 204, PWM input stage 206, digital interface 208 and primary logic 210. Primary side power supply 204 includes power supply circuits, such as regulated voltage supplies and bias generators that are used to provide power to the primary circuits of gate driver integrated circuit 202. PWM input stage 206 may include, for example, input circuitry configured to receive a pulse-width modulated signal PWM to be transmitted to transistor 226. In some embodiments, PWM input stage 206 may be replaced by an input stage configured to receive a digital signal representative of a desired state of transistor 226 (e.g., on or off). Transistor 226 may be implemented using a transistor such as an IGBT transistor, MOS transistor, bipolar transistor, or other transistor type. In some embodiments, transistor 226 may be a power IGBT, MOS or bipolar transistor to support high current and high power applications. In some embodiments, transistor 226 may be a switching transistor used in a switched mode power supply or in a motor.

Digital interface 208 is shown coupled to a digital bus having signals D1 to Dn and may be used to control, configure and monitor the operation of gate driver integrated circuit 202. In various embodiments, digital interface 208 may be a serial bus interface circuit, a parallel bus interface circuit, and/or may comply with any bus standard including, but not limited to SPI, CAN, I2C, LVDS, and USB.

Primary logic 210 on the primary side of gate driver integrated circuit 202 may be used to communicate with secondary logic 216 on the secondary side of integrated circuit via isolation transformers 212 and 214. In an embodiment, primary logic 210 and 216 each include logic, transmitters, receivers and level shifting circuits known in the art that are used to provide communication via isolation transformers 212 and 214. In one embodiment, data is transmitted from primary logic 210 to secondary logic 216 via isolation transformer 212, and is transmitted from secondary logic 216 to primary logic 210 via isolation transformer 214. As is further shown, secondary logic 216 includes safety logic 218 that is configured to place output stage 222 in a known state based on signal SAFE received from analog-to-digital converter and signal detection circuit 224. In some embodiments, safety logic 218 may generate an interrupt that activates an operation mode, such as a safety mode. This operation mode or safety mode may have a limited time duration in some embodiments.

On the secondary side, gate driver integrated circuit 202 includes secondary side power supply 220, output stage 222 and analog-to-digital converter and signal detection circuit 224. Secondary side power supply 220 includes power supply circuits, such as regulated voltage supplies and bias generators that are used to provide power to the secondary side circuits of gate driver integrated circuit 202. Output stage 222 includes driver circuitry configured to drive the transistor 226 via driver pin/terminal GD. Output stage 222 may include feedback circuitry (not shown) configured to receive feedback regarding the current flowing through transistor 226 via pin/terminal ISENSE. Pin/terminal ISENSE is shown coupled between transistor 226 and resistor 228 and is configured to provide a voltage proportional to the current flowing through transistor 226. The feedback circuitry may include, for example, amplifiers, data converters, and other circuitry configured to feed back the received signal path pin/terminal ISENSE to secondary logic 216, primary logic 210 and/or a controller coupled to digital interface 208. In some embodiments, the signal received at pin/terminal ISENSE may be used in a control loop of a power supply to which transistor 226 is connected.

As shown, analog-to-digital converter and signal detection circuit 224 is coupled to pull-up transistor 230 and a resistor network that includes resistors 232 and 234. During operation, analog-to-digital converter and signal detection circuit 224 is configured to measure the voltage of voltage measurement node VHIGH via a resistor divider formed by resistors 232 and 234. In some embodiments, voltage measurement node VHIGH represents a voltage internal or external to gate driver system 200. In some embodiments, voltage measurement node VHIGH is a high voltage node of a switched mode power supply whose voltage can exceed 100V. In various embodiments, resistors 232 and 234 are scaled such that the divided voltage at input pin/terminal ADCIN is within the input range of an analog-to-digital converter within analog-to-digital converter and signal detection circuit 224. In alternative embodiments of the present invention, other circuits providing measurement signals may be coupled to pin/terminal ADCIN. Such circuits may include, for example, a temperature measurement circuit, a voltage sensor circuit, a current sensor circuit, or other sensor circuits. In some embodiments, a plurality of circuits providing measurement signals may be coupled to input pin/terminal ADCIN via a switching circuit or a multiplexer (not shown).

In various embodiments, pull-up transistor 230 is used to activate a safety mode via fault input signal VFAULT coupled to a control node of pull-up transistor 230, analog-to-digital converter and signal detection circuit and signal detection circuit 224 that detects the presence of the safety mode using embodiment circuits and methods, and safety logic 218 within secondary logic 216 that controls the safety mode. When the safety mode is activated, safety logic 218 may cause output stage 222 provide a predetermined output at driver pin/terminal GD. This predetermined state may be a high state configured to turn-on transistor 226 in an active short circuit (ASC) mode, a low state configured to turn-off transistor 226, or a high-impedance state (tristate) configured to provide a high-impedance at driver pin/terminal GD depending on the particular requirements of gate driver system 200. For example, in a typical three-phase motor system, the ASC mode may be used to activate three low-side or three high-side switching transistors (such as IGBTs) to ensure that the electric motor windings have the same potential. In electric car applications, this could prevent charging of a DC link capacitor when a vehicle containing the three-phase motor is towed. The high-impedance state (tristate) may be used, for example, to allow external safety logic to directly control the switching transistors, and the low state may be used, for example, to provide an override mode and/or to place the switching transistors in a predictable default state.

FIG. 2B illustrates analog-to-digital converter and signal detection circuit 224 according to an embodiment of the present invention. As shown, analog-to-digital converter and signal detection circuit and signal detection circuit 224 includes analog-to-digital converter 104, comparator o16 and reference voltage o18 that operate as described above with respect to FIGS. 1A-1D. An optional input interface circuit 260 may be coupled between input pin/terminal ADCIN and analog-to-digital converter 104.

Input interface circuit may include zener diodes 244 and 246, resistors 248 and 250 and buffer 242. Zener diode 244 may be used to clamp the maximum input voltage of pin/terminal ADC to a predetermined voltage and/or to provide electrostatic discharge (ESD) protection. In one embodiment, zener diode 244 has a zener breakdown voltage of about 20 V, however, diodes having other zener breakdown voltages may be used depending on the particular embodiment and its specifications. In some embodiments, zener diode 244 may be omitted, or another type of know ESD structure or device may be used in place of or in addition to zener diode 244.

In some embodiments, an optional resistor divider that includes resistors 248 and 250 may be used to scale down the voltage from input pin/terminal ADCIN to the input of analog-to-digital converter 104. Such a resistor divider may be used, for example, in embodiments in which analog-to-digital converter 104 has a smaller input range than specified input range at input pin/terminal ADCIN. For example, in one embodiment, the specified input range at pin/terminal is 5V, while analog-to-digital converter 104 has an input range of about 2.4V. In such an embodiment, resistors 248 and 250 may be sized to divide the input voltage by a factor of about 2.1. Optional zener diode 246 coupled to resistors 248 and 250 may be used to limit the input voltage of analog-to-digital converter 104. In the above example, the zener voltage of zener diode 246 may be about 3V to prevent an overvoltage condition at the input of analog-to-digital converter 104. It should be understood that other input ranges, divider ratios and zener voltages may be used depending on the particular embodiment and its specifications.

Optional buffer 242 may be coupled between input pin/terminal ADCIN and analog-to-digital converter. Buffer 242 may be implemented using a known buffer circuit including, but not limited to an operational amplifier in a unity gain configuration and/or a source or emitter follower. Amplifiers having a non-unity gain may also be used. Buffer 242 may be used to reduce loading on input pin/terminal ADCIN by analog-to-digital converter 104. In embodiments in which the front-end of analog-to-digital converter 104 contains a switched-capacitor circuit, buffer 242 may serve to isolate switching noise of analog-to-digital converter 104 from input pin/terminal ADCIN.

In some embodiments, an optional deglitching circuit 240 is coupled to the output of comparator 106 to reduce or eliminate glitches or metastability on signal SAFE when the second mode (or safety mode) is asserted. Deglitching circuit 240 may be implemented using deglitching circuits known in the art. One specific example of deglitching circuit 240 is shown in FIG. 2C and includes inverters 252 and AND gate 254 coupled between input node IN and output node OUT. During operation inverters 252 form a delay path. In order for the output of AND gate 254 to be asserted, the input signal at node IN needs to be asserted for at least the duration of the propagation delay of inverters 252. Accordingly, output node OUT of deglitching circuit 240 is not asserted when short spikes are present on input node IN. In various embodiments, any number of inverters 252 may be used depending on the necessary propagation delay and the polarity of the signal at input node IN. In alternative embodiments, inverters 252 may be replaced by other delay circuits known in the art and AND gate 245 may be replaced by other logic functions (or equivalent logic functions) depending on the polarity of the signals as input node IN and output node OUT. In further embodiments, other deglitching circuits such as latches may be used instead of or in addition to the structure shown in FIG. 2C.

Figure 3A:
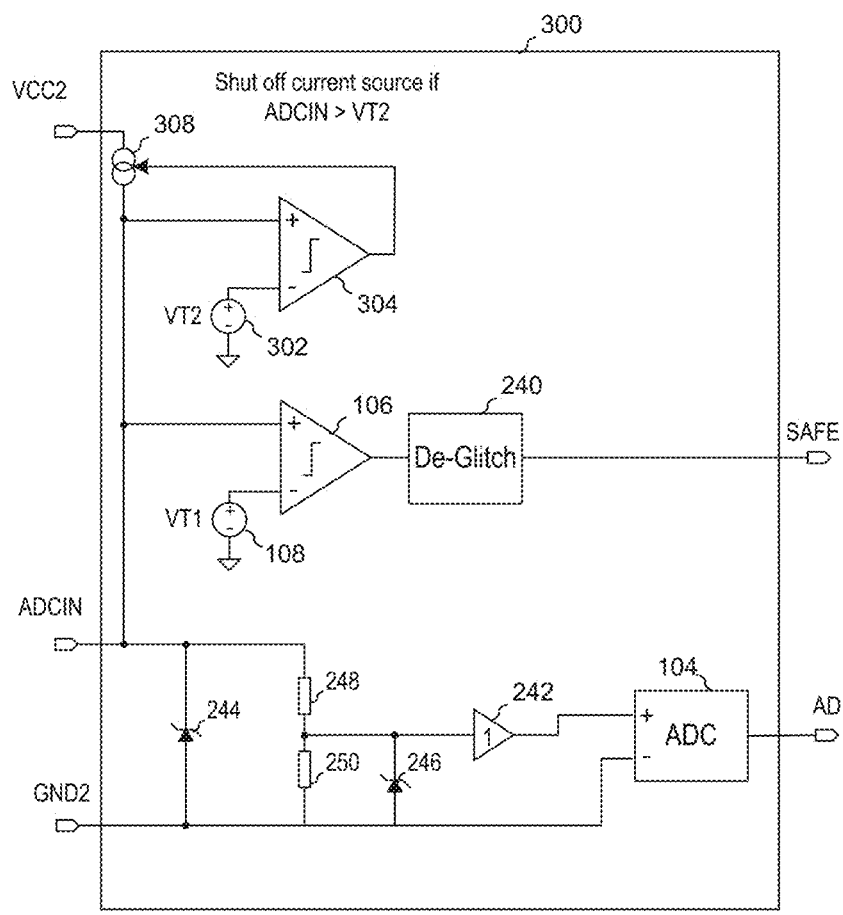
FIG. 3A illustrates an analog-to-digital converter and signal detection circuit according to a further embodiment.

FIG. 3A illustrates signal detection circuit 300 according to a further embodiment of the present invention. Signal detection circuit 300 is similar to analog-to-digital converter and signal detection circuit and signal detection circuit 224 shown in FIG. 2B with the addition of comparator 304, reference voltage 302 and current source 308. In various embodiments, current source 308 may be used to supply a constant current or power to an external detection circuit, such as a temperature detector, coupled to input pin/terminal ADCIN. As shown, comparator 304 is shown having a reference voltage 302 coupled to its negative input to represent a threshold voltage VT2 of comparator 304. In some embodiments, threshold voltage VT2 is set to be a voltage outside of the full-scale input range of analog-to-digital converter 104, either to a voltage that is greater than the full-scale input range of analog-to-digital converter 104, or a voltage that is lower than the full-scale input range of analog-to-digital converter 104.

During operation, in some embodiments, comparator 304 compares the voltage at input pin/terminal ADCIN with threshold voltage VT2. When the voltage at input pin/terminal ADCIN exceeds reference voltage 302, the output of comparator 304 is asserted and current source 308 is shut off via a control terminal connected to the output of comparator 304. It should be understood that comparator 304 and reference voltage 302 are optional. In alternative embodiments, current source 308 may be configured to be always on or may be configured to be activated by an on-chip control signal.

Figure 3B:
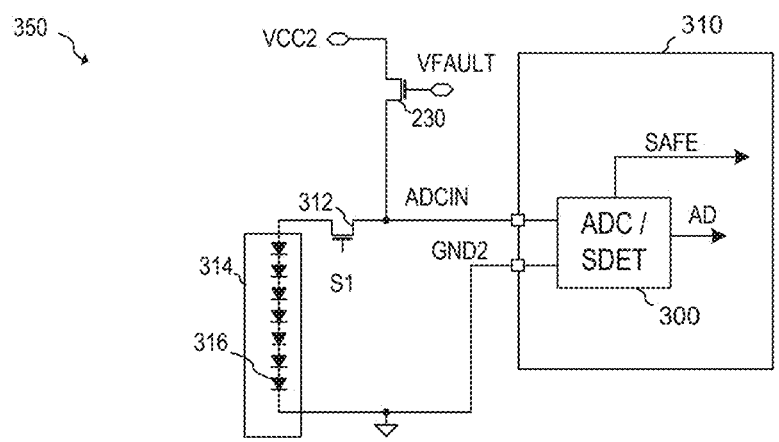
FIG. 3B illustrates a measurement system that utilizes the analog-to-digital converter and signal detection circuit of FIG. 3A.

FIG. 3B illustrates measurement system 350 that utilizes signal detection circuit 30o described with respect to FIG. 3A above. As shown, measurement system 350 includes integrated circuit 310 (which could be representative of any of the embodiments integrated circuits described above). Measurement system 350 also includes temperature sensor 314, pull-up transistor 230 and transistor 312 which are external to integrated circuit 310. In various embodiments, when transistor 312 is activated by signal Si, temperature sensor 314 provides a voltage that is either proportional or inversely proportional to temperature to input pin/terminal ADCIN for conversion by digital-converter 104. During a fault condition, pull-up transistor 230 is turned-on via signal VFAULT and transistor 312 is turned-off by de-asserting signal Si, thereby pulling the voltage of input pin/terminal ADCIN to the voltage present at second power pin/terminal VCC2. In response, signal detection circuit 300 asserts signal SAFE in order to activate a predetermined safety mode.

As shown, temperature detector 314 includes a plurality of diodes 316 coupled in series. In the depicted embodiment, current source 308 shown in FIG. 3A provides a bias current to diodes 316, such that the voltage across diodes 316 is inversely proportional to temperature. This voltage is converted to the digital domain by analog-to-digital converter 104, and the resulting measurement can be used by integrated circuit 310 to estimate a temperature. While a total of seven diodes 316 is shown in FIG. 3B, it should be understood that temperature sensor 314 may include any number of diodes depending on the particular embodiment and its specifications. In alternative embodiments, temperature sensor 314 may be biased by a circuit that is external to integrated circuit 310 instead of from current source 308.

In alternative embodiments, other sensors and circuits may be coupled in parallel with and/or multiplexed with temperature sensor 314 to provide a variety of different measurement for conversion by signal detection circuit 300.

Figure 4:
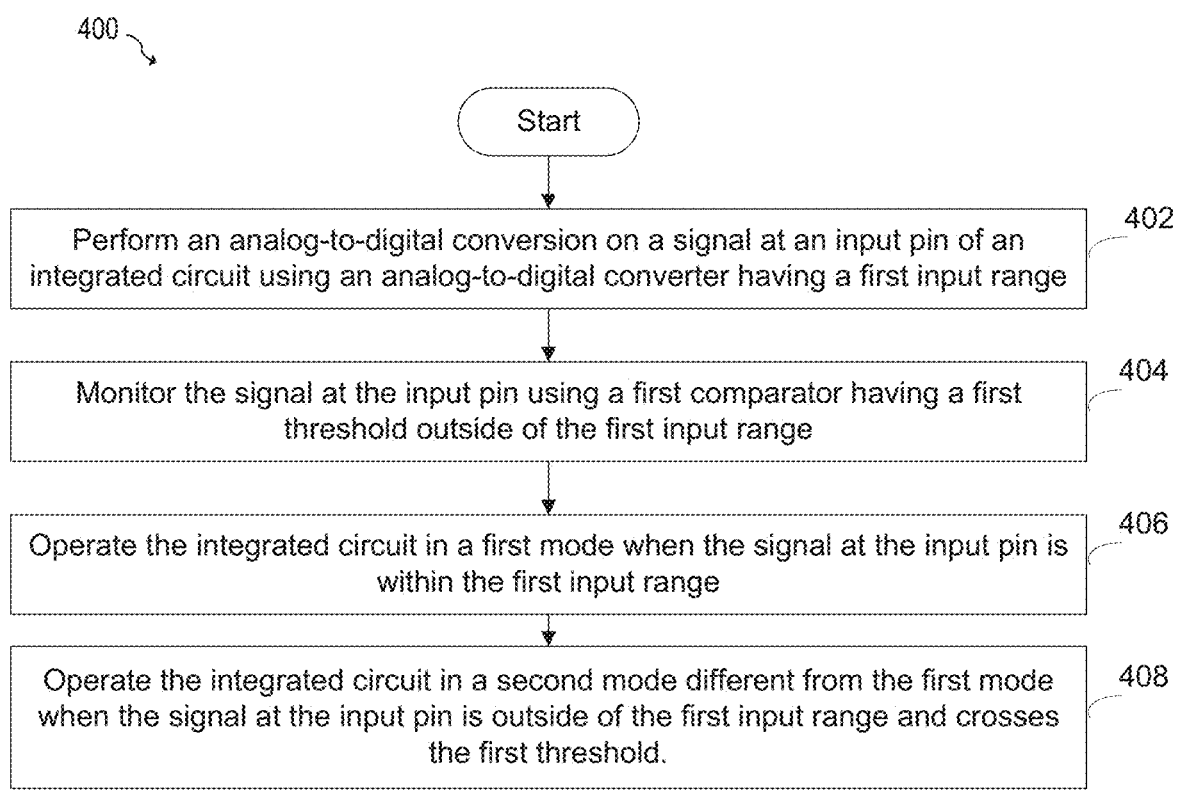
FIG. 4 illustrates a flowchart of an embodiment method.

FIG. 4 illustrates a flowchart of an embodiment method 400 that is applicable to the embodiments disclosed above. In step 402, an analog-to-digital conversion is performed on a signal at an input pin of an integrated circuit using an analog-to-digital converter having a first input range. In various embodiments, the signal may be a voltage and the analog-to-digital conversion is performed by an analog-to-digital converter disposed on the integrated circuit. In alternative embodiments, the signal that is converted into the analog domain may be another type of signal, such as a current.

In step 404, the signal at the input pin is monitored by a first comparator having a first threshold outside of the first input range. In some embodiments, the first threshold may be higher than the input range. A specific example of this is a first input range between 0 V and 5 V and a first threshold at 9V. Alternatively, the first threshold may be lower than the input range. A specific example of this is a first input range between 0V and 5V and a first threshold at −5 V. It should be understood that other input ranges and first threshold values may be used in alternative embodiments.

In step 406, the integrated circuit is operated in a first mode when the signal at the input pin is within the first input range. In various embodiments, this first mode may be a normal operating mode. In step 408, the integrated circuit is operated in a second mode different from the first mode when the signal at the input pin is outside of the first input range and crosses the first threshold. In various embodiments, this second mode may be a "safety" mode in which the integrated circuit executes predefined safety measures in response to the signal crossing the first threshold. Alternatively, this second mode may be a test mode, a programming mode, a configuration mode, or a further normal operation mode. In embodiments in which the first threshold is higher than the first input range, the second mode of operation may be triggered when the input signal exceeds the first threshold. Alternatively, in embodiments in which the first threshold is lower than the first input range, the second mode of operation may be triggered when the input signal decreases below the first threshold. It should be understood that steps 402, 404, 406 and 408 may be performed simultaneously or in a sequence different from that depicted in FIG. 4.

Embodiments of the present invention are summarized here. Other embodiments can also be understood from the entirety of the specification and the claims filed herein.

Example 1

A method including performing an analog-to-digital conversion on a signal at an input pin of an integrated circuit using an analog-to-digital converter having a first input range; monitoring the signal at the input pin using a first comparator having a first threshold outside of the first input range; operating the integrated circuit in a first mode when the signal at the input pin is within the first input range; and operating the integrated circuit in a second mode different from the first mode when the signal at the input pin is outside of the first input range and crosses the first threshold.

Example 2

The method of example 1, where the second mode includes a safety mode.

Example 3

The method of one of examples 1 or 2, further including: driving a gate of a power transistor using a driver circuit disposed on the integrated circuit; and causing an output of the driver circuit to assume a first predetermined state in the second mode.

Example 4

The method of example 3, where the first predetermined state is one of a high state, a low state, or a high-impedance state.

Example 5

The method of one of examples 1 to 4, further including: measuring a temperature using a temperature detector coupled to the input pin; and generating, by the temperature detector, the signal at the input pin based on measuring the temperature.

Example 6

The method of one of examples 1 to 5, further including measuring a first voltage by coupling the input pin to a voltage measurement node via a resistor network.

Example 7

The method of one of examples 1 to 6, further including activating the second mode by closing a switch coupled between a power supply node and the input pin.

Example 8

An integrated circuit including: an analog-to-digital converter (ADC) having an input coupled to an input pin of the integrated circuit, the ADC configured to have a first input range; a first comparator having an input coupled to the input pin, the first comparator having a first threshold outside of the first input range; and a control circuit coupled to the first comparator and configured to: operate the integrated circuit in a first mode when a signal at the input pin is within the first input range, and operate the integrated circuit in a second mode different from the first mode when the signal at the input pin is outside of the first input range and crosses the first threshold.

Example 9

The integrated circuit of example 8, where the second mode includes a safety mode.

Example 10

The integrated circuit of one of examples 8 or 9, where the integrated circuit further includes a gate driver circuit coupled to the control circuit; and the control circuit is further configured to place the gate driver circuit in a first predetermined state in the second mode, where the first predetermined state is one of a low state configured to turn-off a transistor coupled to the gate driver circuit, a high state configured to turn-on the transistor coupled to the gate driver circuit, or a high-impedance state.

Example 11

The integrated circuit of one of examples 8 to 10, further including a current source coupled to the input pin.

Example 12

The integrated circuit of example 11, further including a second comparator having an input coupled to the input pin and an output coupled to a control terminal of the current source, where the second comparator is configured to disable the current source when the signal at the input pin crosses a second threshold, and where the second threshold is outside of the first input range.

Example 13

The integrated circuit of one of examples 8 to 12, further including a resistor divider coupled between the input pin and the input of the ADC.

Example 14

The integrated circuit of example 13, further including a voltage clamping circuit coupled between the resistor divider and the input of the ADC.

Example 15

The integrated circuit of one of examples 8 to 14, further including a buffer circuit coupled between the input pin and the ADC.

Example 16

A system including: a driver integrated circuit, the driver integrated circuit including: an analog-to-digital converter (ADC) having an input coupled to an input pin of the driver integrated circuit, the ADC having a first input range, a first comparator having an input coupled to the input pin, the first comparator including a first threshold outside of the first input range, a driver circuit coupled to an output of the first comparator, the driver circuit having an output configured to drive a control node of a transistor and being configured to operate in a normal operating mode, when a signal at the input pin is within the first input range, and in a safety mode, when the signal at the input pin crosses the first threshold.

Example 17

The system of example 16, where the driver circuit is configured to output a first predetermined state in the safety mode at the output.

Example 18

The system of example 17, where the first predetermined state is one of a low state, a high state or a high-impedance state.

Example 19

The system of one of examples 16 to 18, further including the transistor.

Example 20

The system of one of examples 16 to 19, further including an external clamp transistor having a load path coupled between the input pin and a first power supply node.

Example 21

The system of one of examples 16 to 20, where the first threshold represents a first positive voltage and the first power supply node is configured to have a positive voltage greater than the first threshold; or the first threshold represents a first negative voltage and the first power supply node is configured to have a negative voltage less than the first threshold.

Example 22

The system of one of examples 16 to 21, further including an external temperature sensor having an input coupled to the input pin.

Example 23

The system of example 22, where the driver integrated circuit further includes a current source coupled to the input pin and configured to bias the external temperature sensor.

Example 24

The system of one of examples 16 to 23, further including a resistor network coupled between the input pin and a voltage measurement node.

Example 25

The system of one of examples 16 to 24, where the voltage measurement node is configured to attain a voltage greater than 100 V.

Advantages of embodiments of the present invention include the ability to activate an operation mode (such as a safety mode) on an integrated circuit without devoting extra dedicated pins activation of the operation mode.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
performing an analog-to-digital conversion on a signal at an input pin of an integrated circuit using an analog-to-digital converter having a first input range;
monitoring the signal at the input pin using a first comparator having a first threshold outside of the first input range, wherein the analog-to-digital converter and the first comparator are disposed on a single semiconductor substrate, and the first threshold is set using a voltage reference circuit disposed on the single semiconductor substrate;
operating the integrated circuit in a first mode when the signal at the input pin is within the first input range; and
operating the integrated circuit in a second mode different from the first mode when the signal at the input pin is outside of the first input range and crosses the first threshold.

2. The method of claim 1, wherein the second mode comprises a safety mode.

3. The method of claim 2, further comprising:
driving a gate of a power transistor using a driver circuit disposed on the integrated circuit; and
causing an output of the driver circuit to assume a first predetermined state in the second mode.

4. The method of claim 3, wherein the first predetermined state is one of a high state, a low state, or a high-impedance state.

5. The method of claim 1, further comprising:
measuring a temperature using a temperature detector coupled to the input pin; and
generating, by the temperature detector, the signal at the input pin based on measuring the temperature.

6. The method of claim 1, further comprising measuring a first voltage by coupling the input pin to a voltage measurement node via a resistor network.

7. The method of claim 1, further comprising activating the second mode by closing a switch coupled between a power supply node and the input pin.

8. An integrated circuit comprising:
an analog-to-digital converter (ADC) having an input coupled to an input pin of the integrated circuit, the ADC configured to have a first input range;
a first comparator having an input coupled to the input pin, the first comparator having a first threshold outside of the first input range, wherein the ADC and the first comparator are disposed on a single semiconductor substrate, and the first threshold is set using a voltage reference circuit disposed on the single semiconductor substrate; and
a control circuit coupled to the first comparator and configured to:
operate the integrated circuit in a first mode when a signal at the input pin is within the first input range, and
operate the integrated circuit in a second mode different from the first mode when the signal at the input pin is outside of the first input range and crosses the first threshold.

9. The integrated circuit of claim 8, wherein the second mode comprises a safety mode.

10. The integrated circuit of claim 8, wherein:
the integrated circuit further comprises a gate driver circuit coupled to the control circuit; and
the control circuit is further configured to place the gate driver circuit in a first predetermined state in the second mode, wherein the first predetermined state is one of a low state configured to turn-off a transistor coupled to the gate driver circuit, a high state configured to turn-on the transistor coupled to the gate driver circuit, or a high-impedance state.

11. The integrated circuit of claim 8, further comprising a current source coupled to the input pin.

12. The integrated circuit of claim 11, further comprising a second comparator having an input coupled to the input pin and an output coupled to a control terminal of the current source, wherein the second comparator is configured to disable the current source when the signal at the input pin crosses a second threshold, and wherein the second threshold is outside of the first input range.

13. The integrated circuit of claim 8, further comprising a resistor divider coupled between the input pin and the input of the ADC.

14. The integrated circuit of claim 13, further comprising a voltage clamping circuit coupled between the resistor divider and the input of the ADC.

15. The integrated circuit of claim 8, further comprising a buffer circuit coupled between the input pin and the ADC.

16. A system comprising:
a driver integrated circuit, the driver integrated circuit comprising:
an analog-to-digital converter (ADC) having an input coupled to an input pin of the driver integrated circuit, the ADC having a first input range,
a first comparator having an input coupled to the input pin, the first comparator comprising a first threshold outside of the first input range, wherein the analog-to-digital converter and the first comparator are disposed on a single semiconductor substrate, and the first threshold is set using a voltage reference circuit disposed on the single semiconductor substrate, and
a driver circuit coupled to an output of the first comparator, the driver circuit having an output configured to drive a control node of a transistor and being configured to operate in a normal operating mode, when a signal at the input pin is within the first input range, and in a safety mode, when the signal at the input pin crosses the first threshold.

17. The system of claim 16, wherein the driver circuit is configured to output a first predetermined state in the safety mode at the output.

18. The system of claim 17, wherein the first predetermined state is one of a low state, a high state or a high-impedance state.

19. The system of claim 16, further comprising the transistor.

20. The system of claim 16, further comprising an external clamp transistor having a load path coupled between the input pin and a first power supply node.

21. The system of claim 20, wherein:
the first threshold represents a first positive voltage and the first power supply node is configured to have a positive voltage greater than the first threshold; or
the first threshold represents a first negative voltage and the first power supply node is configured to have a negative voltage less than the first threshold.

22. The system of claim 20, further comprising an external temperature sensor having an input coupled to the input pin.

23. The system of claim 22, wherein the driver integrated circuit further comprises a current source coupled to the input pin and configured to bias the external temperature sensor.

24. The system of claim 20, further comprising a resistor network coupled between the input pin and a voltage measurement node.

25. The system of claim 24, wherein the voltage measurement node is configured to attain a voltage greater than 100 V.

\* \* \* \* \*